US009589724B2

(12) United States Patent
Choi

(10) Patent No.: US 9,589,724 B2
(45) Date of Patent: Mar. 7, 2017

(54) CHIP ELECTRONIC COMPONENT AND METHOD OF MANUFACTURING THE SAME

(71) Applicant: SAMSUNG ELECTRO-MECHANICS CO., LTD., Suwon-Si, Gyeonggi-Do (KR)

(72) Inventor: Min Sung Choi, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 74 days.

(21) Appl. No.: 14/259,053

(22) Filed: Apr. 22, 2014

(65) Prior Publication Data

US 2015/0123757 A1 May 7, 2015

(30) Foreign Application Priority Data

Nov. 4, 2013 (KR) ........................ 10-2013-0132914

(51) Int. Cl.
*H01L 21/70* (2006.01)
*H01F 41/04* (2006.01)
*H01F 17/00* (2006.01)
*H01F 17/04* (2006.01)
*H01F 27/29* (2006.01)

(52) U.S. Cl.
CPC ....... *H01F 41/046* (2013.01); *H01F 17/0013* (2013.01); *H01F 17/04* (2013.01); *H01F 27/292* (2013.01); *Y10T 29/49078* (2015.01)

(58) Field of Classification Search
USPC .......................... 257/295, E43.001–E43.007, 257/E27.005–E27.006, E27.008, 257/E29.164, E29.167, E29.272, 257/E29.323, E27.104, E21.436, 257/E21.663–E21.665, 773, 421
See application file for complete search history.

(56) References Cited

U.S. PATENT DOCUMENTS

2013/0214889 A1* 8/2013 Kim .................... H01F 17/0033 336/192
2014/0097923 A1* 4/2014 Naito .................. H01F 17/0033 336/83
2015/0116891 A1* 4/2015 Park ......................... H01G 4/40 361/270

FOREIGN PATENT DOCUMENTS

JP 2005-210010 A 8/2005
JP 2008-166455 A 7/2008

* cited by examiner

*Primary Examiner* — Dao H Nguyen
*Assistant Examiner* — Tram H Nguyen
(74) *Attorney, Agent, or Firm* — McDermott Will & Emery LLP

(57) ABSTRACT

A chip electronic component may include an insulating layer formed on a lower portion of a side surface of an internal coil pattern to avoid a direct contact between the internal coil pattern and a magnetic material, thereby preventing a wave-form distortion indicating a reduction in inductance at high frequency.

16 Claims, 7 Drawing Sheets

CHIP ELECTRONIC COMPONENT AND METHOD OF MANUFACTURING THE SAME

CROSS-REFERENCE TO RELATED APPLICATION

This application claims the benefit of Korean Patent Application No. 10-2013-0132914 filed on Nov. 4, 2013, with the Korean Intellectual Property Office, the disclosure of which is incorporated herein by reference.

BACKGROUND

The present disclosure relates to a chip electronic component and a method of manufacturing the same, and more particularly, to a chip inductor included in an information technology (IT) device, or the like, to remove noise.

An inductor, which is one of chip electronic components, is a representative passive element configuring an electronic circuit together with a resistor and a capacitor to remove noise. The inductor is combined with the capacitor using electromagnetic properties to configure a resonance circuit amplifying a signal in a specific frequency band, a filter circuit, or the like.

Recently, as miniaturization and thinness of information technology (IT) devices such as various communications devices, display devices, or the like, have been accelerated, research into a technology for miniaturizing and thinning various elements such as an inductor, a capacitor, a transistor, and the like, used in these IT devices has been continuously conducted. The inductor has also been rapidly replaced by a chip having a small size and a high density and capable of being automatically surface-mounted, and a thin film type inductor in which a mixture of magnetic powder and resin is formed on a coil pattern formed on upper and lower surfaces of a thin film insulating substrate by plating has been developed.

In the thin film inductor, after the coil pattern is formed on the insulating substrate, an insulating layer is formed thereon so as to prevent a contact between the coil pattern and a magnetic material. However, according to the related art, the insulating layer is only formed on an upper portion of the coil pattern, but is not extended up to a lower portion of a side surface of the coil pattern, whereby a leakage current may be generated due to a direct contact between the coil pattern and the metal magnetic material, or the like. Therefore, inductance has been normal at a frequency of 1 MHz, but has rapidly been decreased at high frequency, thereby causing a waveform distortion.

FIG. 1 is an enlarged scanning electron microscope (SEM) photograph of a coil pattern having an insulating layer formed thereon in a thin film inductor according to the related art. Referring to FIG. 1, it may be seen that the insulating layer is not formed on a lower portion of the coil pattern, such that the coil pattern directly contacts a magnetic material.

The following Patent Documents 1 and 2 disclose a thin film inductor including an internal coil pattern formed on upper and lower surfaces of an insulating substrate by plating. However, processes disposed in Patent Documents 1 and 2 have a limitation in forming an insulating layer to extend up to a lower portion of the internal coil pattern.

RELATED ART DOCUMENT (Patent Document 1) Japanese Patent Laid-open Publication No. 2005-210010

(Patent Document 2) Japanese Patent Laid-open Publication No. 2008-166455

SUMMARY

An aspect of the present disclosure may provide a chip electronic component including an insulating layer extended up to a lower portion of aside surface of an internal coil pattern such that the internal coil pattern has no direct contact with a magnetic material, thereby preventing a waveform distortion at high frequency, and a method of manufacturing the same.

According to aspect of the present disclosure, a chip electronic component may include: a magnetic body including an insulating substrate; an internal conductor pattern part formed on at least one surface of the insulating substrate; an insulating layer coating the internal conductor pattern part; and external electrodes formed on at least one end surface of the magnetic body and connected to the internal conductor pattern part, wherein the insulating layer includes a first insulating layer coating an upper portion of the internal conductor pattern part and a second insulating layer coating a side surface of the internal conductor pattern part.

When a thickness of the internal conductor pattern part is t, the second insulating layer formed on the side surface of the internal conductor pattern part may have a height of 0.15t to 0.85t from a lower portion of the side surface of the internal conductor pattern part.

The second insulating layer may be further formed on the first insulating layer formed on the upper portion of the internal conductor pattern part.

The second insulating layer formed on the first insulating layer may have a thickness of 0.1 μm to 10.5 μm.

Conductor pattern portions forming the internal conductor pattern part may have the first insulating layer interposed therebetween.

The first insulating layer may include a photoresist (PR).

The second insulating layer may contain at least one selected from a group consisting of a novolac based epoxy resin and a rubber based polymer epoxy resin.

The internal conductor pattern part may be coated with both of the first and second insulating layers to avoid a direct contact with a magnetic material forming the magnetic body.

According to another aspect of the present disclosure, a method of manufacturing a chip electronic component may include: forming an internal conductor pattern part on at least one surface of an insulating substrate; forming an insulating layer to coat the internal conductor pattern part therewith; stacking magnetic layers on upper and lower portions of the internal conductor pattern part formed on the insulating substrate to form a magnetic body; and forming external electrodes on at least one end surface of the magnetic body to be connected to the internal conductor pattern part, wherein the forming of the insulating layer may include forming a first insulating layer coating the upper portion of the internal conductor pattern part and forming a second insulating layer coating a side surface of the internal conductor pattern part.

The forming of the second insulating layer may be performed by vacuum processing after dipping the internal conductor pattern part into a resin used for forming the second insulating layer.

The resin may include at least one selected from a group consisting of a novolac based epoxy resin and a rubber based polymer epoxy resin.

The vacuum processing may be performed to satisfy 85 torr to 0 torr.

The vacuum processing may be performed for two to ten minutes.

When a thickness of the internal conductor pattern part is t, the second insulating layer formed on the side surface of the internal conductor pattern part may be formed to have a height of 0.15t to 0.85t from a lower portion of the side surface of the internal conductor pattern part.

The second insulating layer may be further formed on the first insulating layer formed on the upper portion of the internal conductor pattern part.

Conductor pattern portions forming the internal conductor pattern part may have the first insulating layer interposed therebetween.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
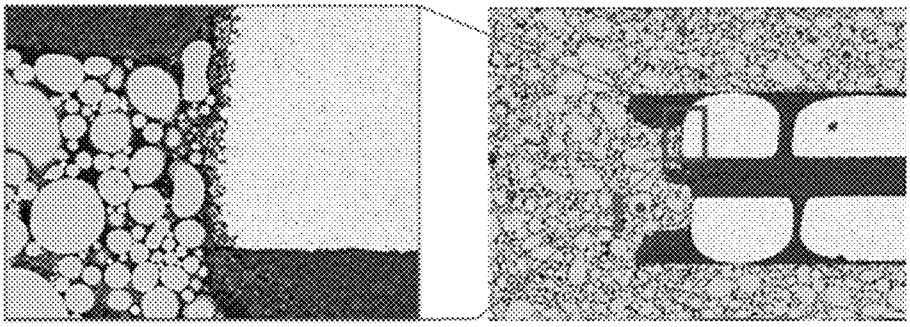
FIG. 1 is an enlarged scanning electron microscope (SEM) photograph of a coil pattern having an insulating layer formed thereon in a thin film inductor according to the related art.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Chip Electronic Component

Hereinafter, a chip electronic component according to an exemplary embodiment of the present disclosure, particularly, a thin film inductor will be described. However, the present disclosure is not limited thereto.

Figure 2:
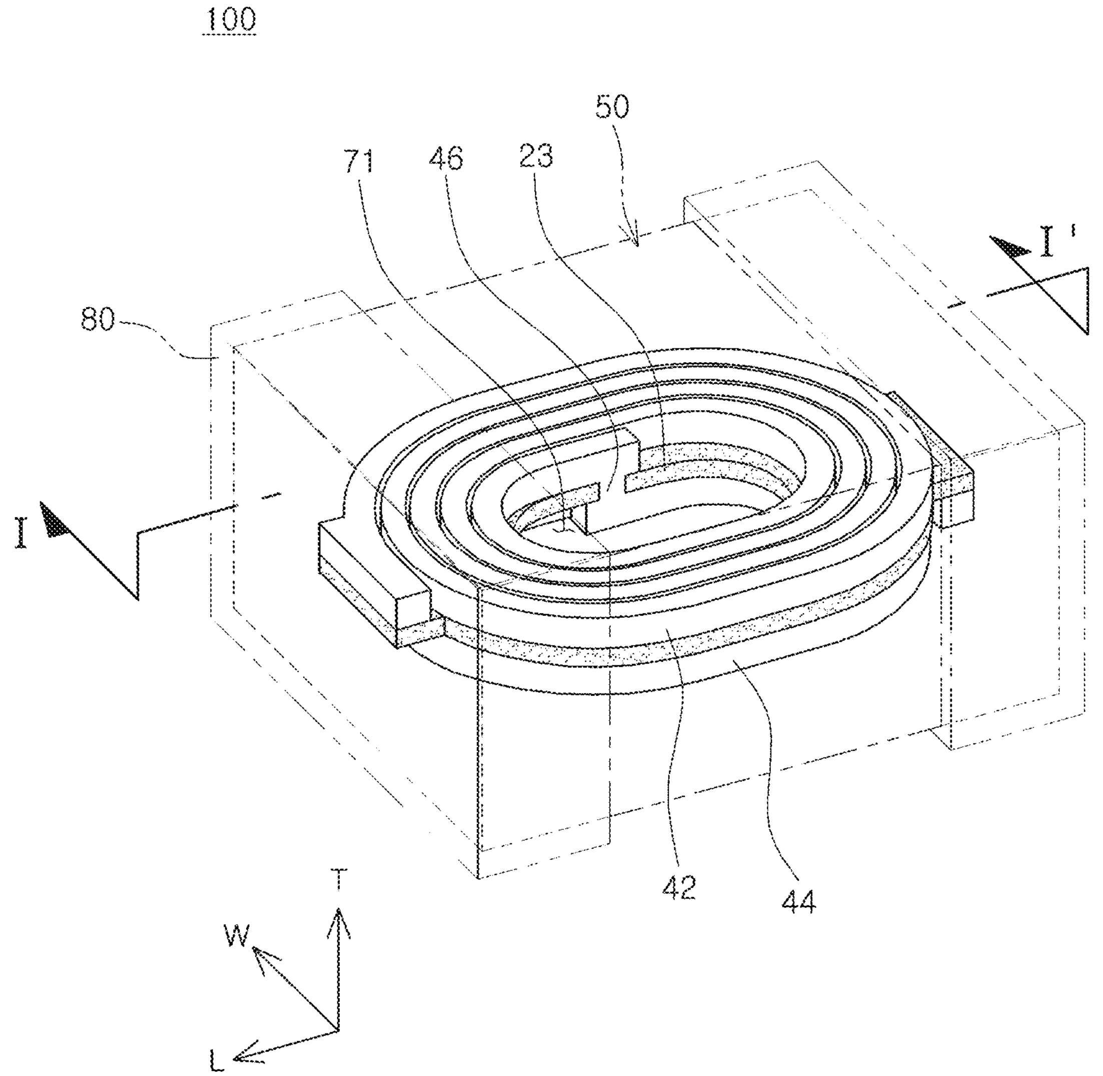
FIG. 2 is a schematic perspective view illustrating a coil pattern disposed within a chip electronic component according to an exemplary embodiment of the present disclosure.
Figure 3:
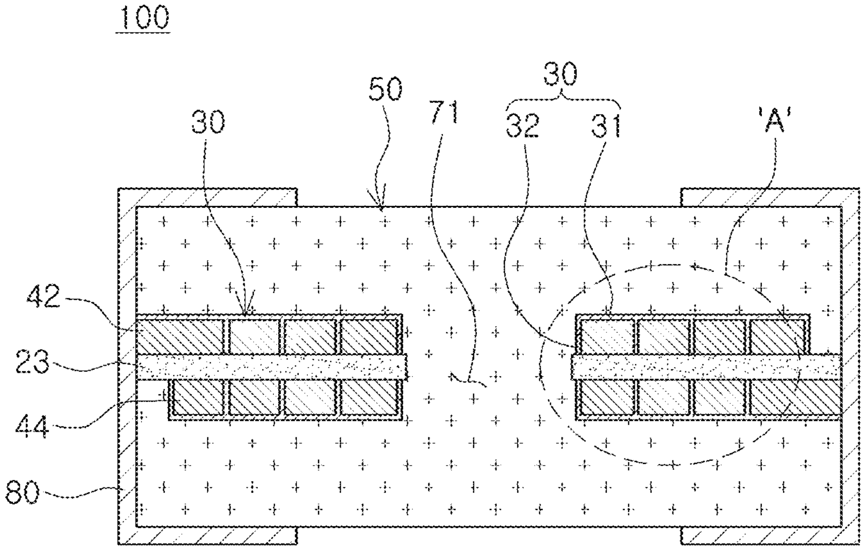
FIG. 3 is a cross-sectional view taken along line I-I' of FIG. 2.
Figure 4:
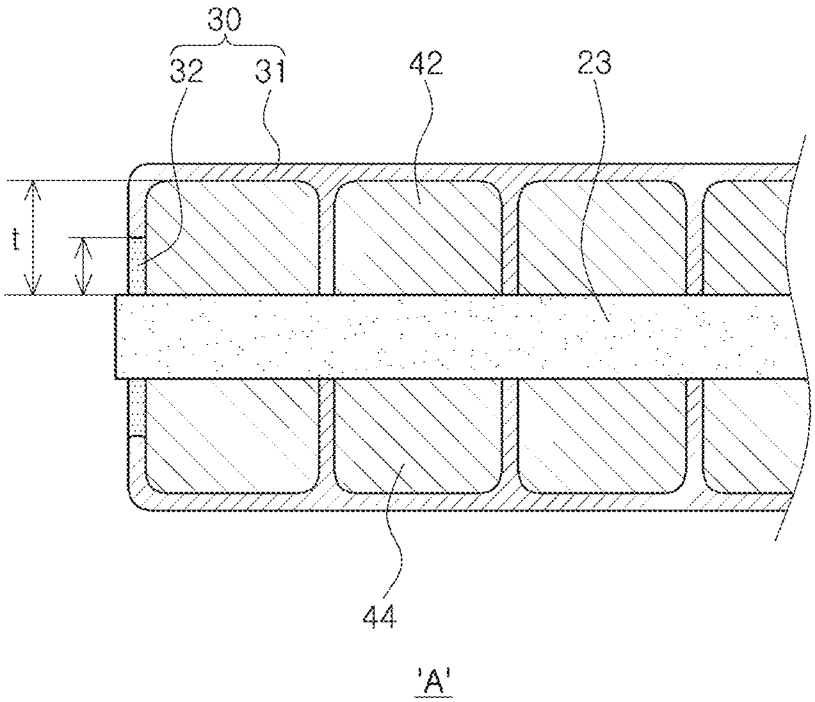
FIG. 4 is a schematic enlarged view of an example of part A of FIG. 3.
Figure 5:
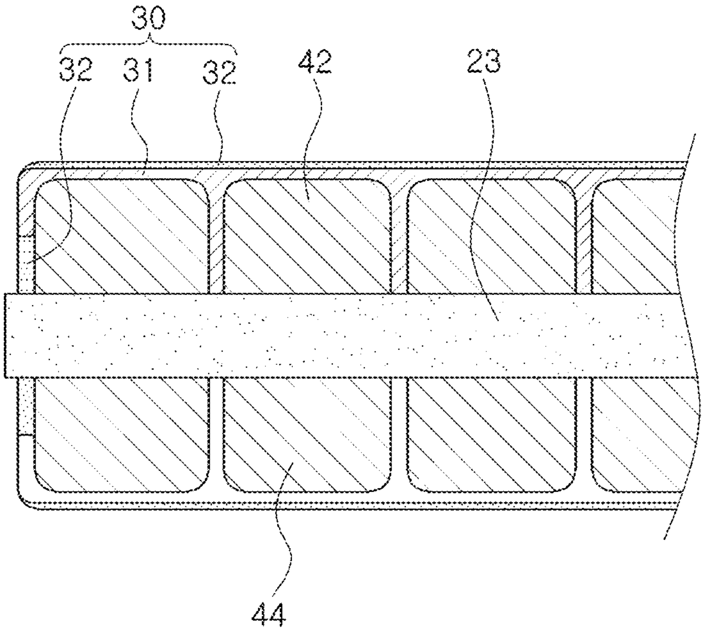
FIG. 5 is a schematic enlarged view of another example of part A.
Figure 6:
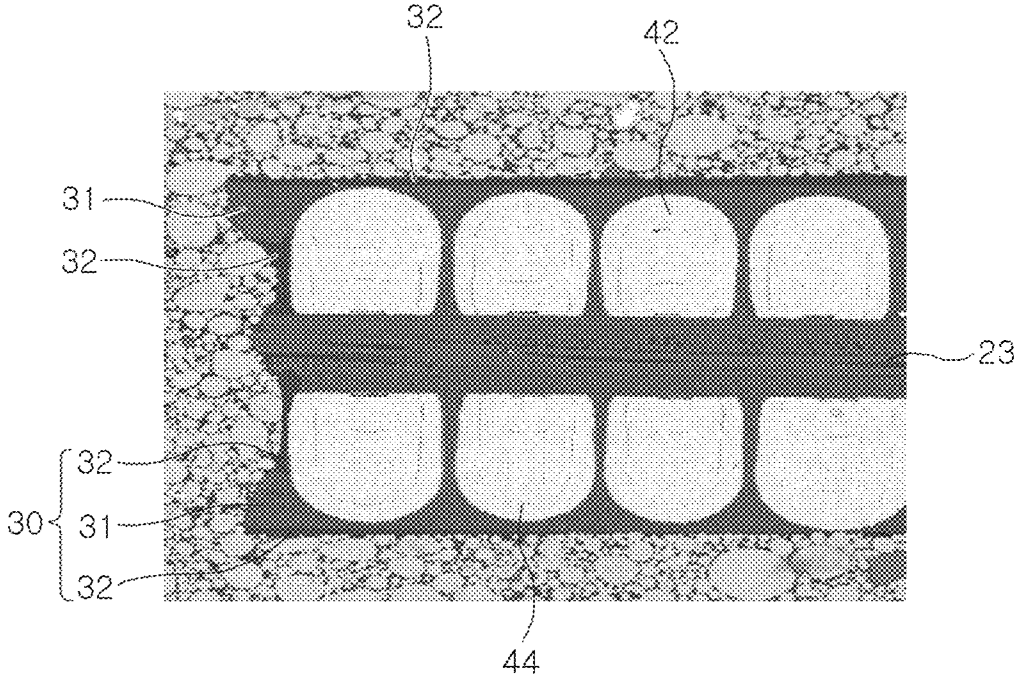
FIG. 6 is an enlarged SEM photograph of a coil pattern having an insulating layer formed thereon in a thin film type inductor according to an exemplary embodiment of the present disclosure.

FIG. 2 is a schematic perspective view illustrating a coil pattern disposed within a chip electronic component according to an exemplary embodiment of the present disclosure; FIG. 3 is a cross-sectional view taken along line I-I' of FIG. 2; FIG. 4 is a schematic enlarged view of an example of part A of FIG. 3; and FIG. 5 is a schematic enlarged view of another example of part A.

Referring to FIGS. 2 through 5, a thin-film-type chip inductor 100 used in a power line of a power supply circuit is disclosed as an example of a chip electronic component. A chip bead, a chip filter, and the like, as well as the chip inductor may be appropriately used as the chip electronic component.

The thin film inductor 100 may include a magnetic body 50, an insulating substrate 23, internal conductor pattern parts 42 and 44, an insulating layer 30, and external electrodes 80.

The magnetic body 50 may form an exterior appearance of the thin film inductor 100 and may be formed of any material that exhibits magnetic properties. For example, the magnetic body 50 may be formed by filling ferrite or a metal based soft magnetic material. Mn—Zn based ferrite, Ni—Zn based ferrite, Ni—Zn—Cu based ferrite, Mn—Mg based ferrite, Ba based ferrite, Li based ferrite, or the like, may be used as the ferrite, and Fe—Si—B—Cr based amorphous metal powder may be used as the metal based soft magnetic material. However, the material of the magnetic body 50 is not limited thereto.

The magnetic body 50 may have a hexahedral shape. Directions of a hexahedron will be defined in order to clearly describe an exemplary embodiment of the present disclosure. L, W and T of a hexahedron shown in FIG. 2 refer to a length direction, a width direction, and a thickness direction, respectively. The magnetic body 50 may have a rectangular parallelepiped shape in which a length thereof in the length direction is greater than a length thereof in the width direction.

The insulating substrate 23 formed in the magnetic body 50 may be formed of a thin film, and may be formed of any material capable of being used in a plating process for forming the internal conductor pattern parts 42 and 44. For example, the insulating substrate 23 may be formed of a printed circuit board (PCB), a ferrite substrate, a metal based soft magnetic substrate, or the like.

The insulating substrate 23 may have a through hole formed in a central portion thereof, wherein the through hole may be filled with a magnetic material such as ferrite, a metal based soft magnetic material, or the like, to form a core part 71. The core part 71 may be filled with the magnetic material, thereby increasing inductance L.

The internal conductor pattern part 42 may be formed on one surface of the insulating substrate 23 and the internal conductor pattern part 44 may be formed on the other surface thereof, wherein the internal conductor pattern parts 42 and 44 may have a coil shaped pattern.

The internal conductor pattern parts 42 and 44 may include a spiral-shaped coil pattern, and the internal conductor pattern parts 42 and 44 formed on one surface and the other surface of the insulating substrate 23 may be electrically connected to each other through a via electrode 46 formed in the insulating substrate 23.

The internal conductor pattern parts 42 and 44 and the via electrode 46 may be formed of a metal having excellent electrical conductivity, for example, silver (Ag), copper (Cu), nickel (Ni), aluminum (Al), an alloy thereof, or the like.

The internal conductor pattern parts 42 and 44 may be coated with the insulating layer 30, wherein the insulating layer 30 may include a first insulating layer 31 coating upper portions of the internal conductor pattern parts 42 and 44 and a second insulating layer 32 coating side surfaces of the internal conductor pattern parts 42 and 44.

The first insulating layer 31 may be formed by a process well-known in the art such as a screen printing process, an exposure and development process of a photoresist (PR), a spray process, or the like, to coat the upper portions of the internal conductor pattern parts 42 and 44. In the case in which the first insulating layer 31 is formed by the exposure and development process of a photoresist (PR), the first insulating layer 31 may include the photoresist (PR).

In the case of using a process of forming an insulating layer according to the related art, the insulating layer was only formed on upper portions of internal conductor pattern parts and was not formed on lower portions of side surfaces of the internal conductor pattern parts, such that the lower portions of the side surfaces of the internal conductor pattern parts were exposed to directly contact a magnetic material forming the magnetic body.

Therefore, the insulating layer 30 according to the exemplary embodiment of the present disclosure may further include the second insulating layer 32 formed on the lower portions of the side surfaces of the internal conductor pattern parts 42 and 44 to prevent a direct contact between the internal conductor pattern parts 42 and 44 and the magnetic material, thereby preventing a leakage current and a waveform distortion indicating a reduction in inductance at high frequency.

The second insulating layer 32 may be formed by additionally performing a vacuum dipping process using an epoxy-based resin, or the like, after the first insulating layer 31 is formed.

The second insulating layer 32 may contain a novolac based epoxy resin, a rubber based polymer epoxy resin, or a mixture thereof, but is not limited thereto.

The rubber based polymer epoxy resin may have a molecular weight of 15000 or more, and the polymer may be a phenoxy resin, a polyimide resin, a polyamideimide (PAI) resin, a polyetherimide (PEI) resin, a polysulfone (PS) resin, a polyethersulfone (PES) resin, a polyphenyleneether (PPE) resin, a polycarbonate (PC) resin, a polyetheretherketone (PEEK) resin, a polyester resin, or a mixture thereof.

In addition, the second insulating layer 32 may further contain a rubber based toughening agent, and a content of the rubber based toughening agent may be 1 to 30 parts per hundred resin (PHRs) based on the epoxy resin.

The second insulating layer 32 may be formed on the lower portions of the side surfaces of the internal conductor pattern parts 42 and 44 that are not coated with the first insulating layer 31. Here, the lower portions of the side surfaces of the internal conductor pattern parts 42 and 44 may include lower portions of side surfaces of the outermost pattern portions of the internal conductor pattern parts 42 and 44 and lower portions of side surfaces of the innermost pattern portions thereof in contact with the core part 71. Conductor pattern portions forming the internal conductor pattern parts 42 and 44 may have the first insulating layer 31 interposed therebetween.

When the thickest portion of the internal conductor pattern part 42 or 44 is referred to as a thickness t of the internal conductor pattern part 42 or 44, the second insulating layer formed on the side surface of the internal conductor pattern part may have a height of 0.15t to 0.85t from the lower portion of the side surface of the internal conductor pattern part. Here, the thickness t of the internal conductor pattern part 42 or 44 may be 60 μm to 300 μm.

In addition, the second insulating layer 32 may also be formed on the first insulating layer 31 formed on the upper portions of the internal conductor pattern parts 42 and 44, and the second insulating layer 32 formed on the first insulating layer 31 may have a thickness of 0.1 μm to 10.5 μm.

As described above, the internal conductor pattern parts 42 and 44 according to this exemplary embodiment of the present disclosure may be coated with the first and second insulating layers 31 and 32, so that they do not directly contact the magnetic material forming the magnetic body 50.

One end of the internal conductor pattern part 42 formed on one surface of the insulating substrate 23 may be exposed to one end surface of the magnetic body 50 in the length direction thereof, and one end of the internal conductor pattern part 44 formed on the other surface of the insulating substrate 23 may be exposed to the other end surface of the magnetic body 50 in the length direction thereof.

The external electrodes 80 may be formed on both end surfaces of the magnetic body 50 in the length direction thereof, respectively, so as to be connected to the internal conductor pattern parts 42 and 44 exposed to the end surfaces of the magnetic body 50 in the length direction thereof. The external electrodes 80 may be extended to both end surfaces of the magnetic body 50 in the thickness direction thereof and/or both end surfaces of the magnetic body 50 in the width direction thereof.

The external electrodes 80 may be formed of a metal having excellent electrical conductivity, for example, nickel (Ni), copper (Cu), tin (Sn), silver (Ag), or an alloy thereof.

Method of Manufacturing Chip Electronic Component

Figure 7:
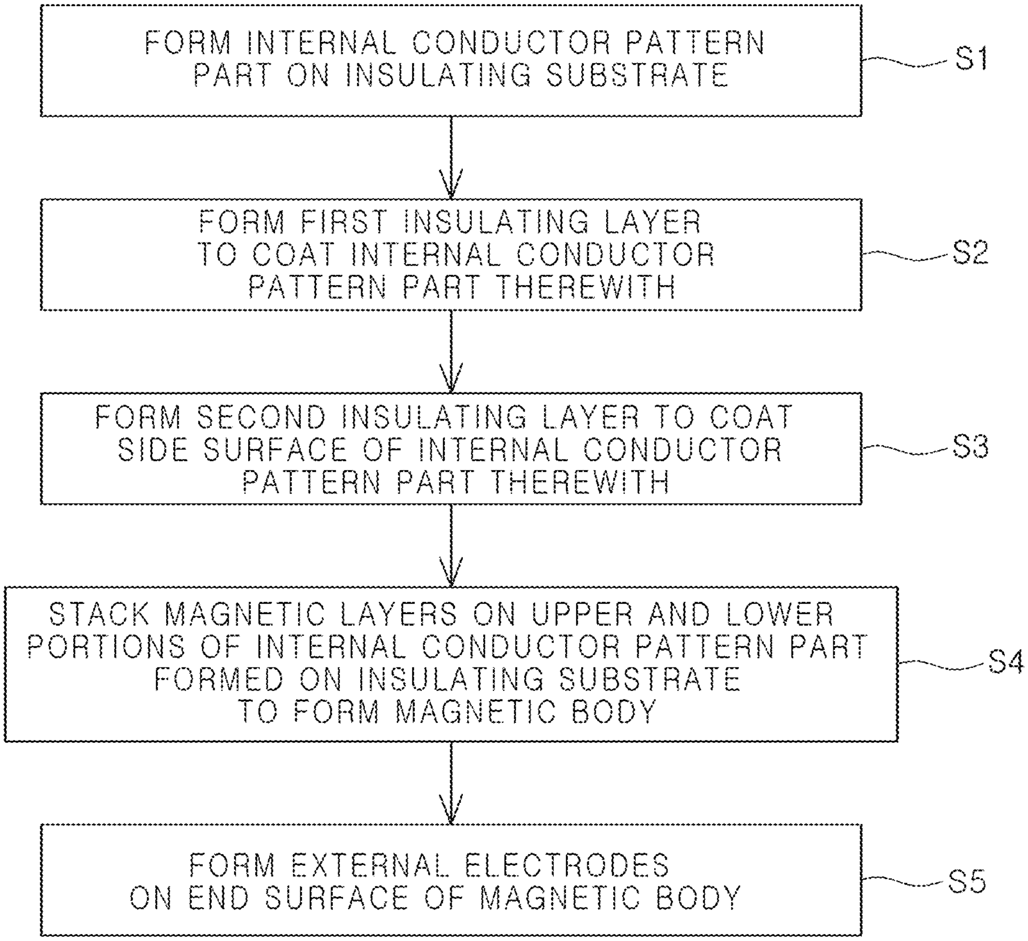
FIG. 7 is a flowchart illustrating a process of manufacturing a chip electronic component according to an exemplary embodiment of the present disclosure.

FIG. 7 is a flowchart illustrating a process of manufacturing a chip electronic component according to an exemplary embodiment of the present disclosure.

Referring to FIG. 7, the internal conductor pattern parts 42 and 44 may be formed on the insulating substrate 23 (S1).

The internal conductor pattern parts may be formed on the thin film insulating substrate by an electroplating method, or the like. Here, the insulating substrate is not particularly limited, but may be, for example, a PCB, a ferrite substrate, a metal based soft magnetic substrate, or the like, and may have a thickness of 40 μm to 100 μm.

A method of forming the internal conductor pattern parts may be, for example, an electroplating method, but is not limited thereto. The internal conductor pattern parts may be formed of a metal having excellent electrical conductivity, for example, silver (Ag), copper (Cu), nickel (Ni), aluminum (Al), an alloy thereof, or the like.

A via electrode may be formed by forming a through hole in a portion of the insulating substrate and filling the through hole with a conductive material, and the internal conductor pattern parts formed on one surface and the other surface of the insulating substrate may be electrically connected to each other through the via electrode.

The through hole may be formed in a central portion of the insulating substrate by performing a drilling process, a laser process, a sand blast process, a punching process, or the like.

Next, the first insulating layer 31 may be form to cover the internal conductor pattern parts formed on one surface and the other surface of the insulating substrate (S2).

The first insulating layer may be formed by a method known in the art such as a screen printing process, an exposure and development process of a photo resist (PR), a spray process, or the like, but the present disclosure is not limited thereto. Therefore, the upper portions of the internal conductor pattern parts may be coated with the first insulating layer.

The first insulating layer formed by a conventional insulating layer forming process as described above is formed on the upper portions of the internal conductor pattern parts, but may fail to cover the lower portions of the side surfaces of the internal conductor pattern parts, and thus, the lower portions of the side surfaces of the internal conductor pattern parts may be exposed to directly contact a magnetic material forming the magnetic body.

Therefore, in the exemplary embodiment of the present disclosure, the second insulating layer 32 may be formed by additionally performing a vacuum dipping process using an epoxy-based resin, or the like, after the forming of the first insulating layer.

That is, next, the second insulating layer 32 may be formed so as to coat the side surfaces of the internal conductor pattern parts (S3).

In detail, the second insulating layer may be formed by performing vacuum processing after dipping the internal conductor pattern parts into a resin used for forming the second insulating layer.

Here, the resin used for forming the second insulating layer may be a novolac based epoxy resin, a rubber based polymer epoxy resin, or a mixture thereof, but is not limited thereto.

The rubber based polymer epoxy resin may have a molecular weight of 15000 or more, and the polymer may be a phenoxy resin, a polyimide resin, a polyamideimide (PAI) resin, a polyetherimide (PEI) resin, a polysulfone (PS) resin, a polyethersulfone (PES) resin, a polyphenyleneether (PPE) resin, a polycarbonate (PC) resin, a polyetheretherketone (PEEK) resin, a polyester resin, or a mixture thereof.

A concentration of the epoxy-based resin forming the second insulating layer may be 10 wt % to 35 wt %. In the case in which the concentration of the epoxy-based resin forming the second insulating layer is less than 10 wt %, the second insulating layer may be excessively thin, and in the case in which the concentration of the epoxy-based resin forming the second insulating layer exceeds 35 wt %, the second insulating layer may be excessively thick.

In addition, the second insulating layer 32 may further contain a rubber based toughening agent and the content of the rubber based toughening agent may be 1 to 30 PHRs based on the epoxy-based resin.

After the internal conductor pattern parts are dipped into the resin, the vacuum processing may be performed to satisfy the degree of vacuum of 85 torr to 0 torr. In the case in which the pressure exceeds 85 torr, the insulating layer may not be uniformly formed, and in the case in which the pressure is less than 0 torr, the concentration of the epoxy-based resin may be increased due to volatilization of a solvent, so that the second insulating layer may become excessively thick.

After the internal conductor pattern parts are dipped into the resin, the vacuum processing may be performed for two to ten minutes. In the case in which the vacuum processing is performed for less than two minutes, bubbles may not be entirely removed so that the second insulating layer may not be uniformly formed, and in the case in which the vacuum processing is performed in excess of ten minutes, a concentration of the epoxy resin may become high, so that the second insulating layer may become excessively thick.

As described above, the method of manufacturing a chip electronic component according to the exemplary embodiment of the present disclosure may further include forming the second insulating layer by the vacuum dipping process, such that the second insulating layer is formed on the lower portions of the side surfaces of the internal conductor pattern parts, thereby preventing the internal conductor pattern parts from directly contacting the magnetic material forming the magnetic body. Therefore, a leakage current resulting from a direct contact between the internal conductor pattern parts and the magnetic material and a waveform distortion indicating a reduction in inductance at high frequency may be prevented.

Next, magnetic layers may be stacked on the upper and lower portions of the internal conductor pattern parts formed on the insulating substrate to thereby form the magnetic body 50 (S4).

The magnetic layers may be stacked on both surfaces of the insulating substrate, respectively, and be compressed using a laminate method or an isostatic press method, thereby forming the magnetic body. In this case, the hole may be filled with the magnetic material to form the core part 71.

Next, the external electrodes 80 may be formed to be connected to the internal conductor pattern parts exposed to the end surfaces of the magnetic body (S5).

The external electrodes may be formed of a paste containing a metal having excellent electrical conductivity, for example, a conductive paste containing nickel (Ni), copper (Cu), tin (Sn), silver (Ag), or an alloy thereof. The external electrodes may be formed by a dipping method, or the like, as well as a printing method depending on a shape thereof.

A description of features the same as those of the chip electronic component according to the foregoing exemplary embodiment of the present disclosure will be omitted.

As set forth above, in a chip electronic component and a method of manufacturing the same according to exemplary embodiment of the present disclosure, the insulating layer is also formed on the lower portion of the side surface of the internal coil pattern to prevent a direct contact between the internal coil pattern and a magnetic material, whereby a waveform distortion indicating a reduction in inductance at a high frequency may be prevented.

While exemplary embodiments have been shown and described above, it will be apparent to those skilled in the art that modifications and variations could be made without departing from the spirit and scope of the present disclosure as defined by the appended claims.

What is claimed is:

1. A chip electronic component, comprising:

a magnetic body including an insulating substrate;

an internal conductor pattern part disposed on at least one surface of the insulating substrate;

an insulating layer coating the internal conductor pattern part; and external electrodes disposed on at least one end surface of the magnetic body and connected to the internal conductor pattern part, wherein the insulating layer includes a first insulating layer coating an upper portion of the internal conductor pattern part and a second insulating layer coating a side surface of the internal conductor pattern part.

2. The chip electronic component of claim 1, wherein when a thickness of the internal conductor pattern part is t, the second insulating layer formed on the side surface of the internal conductor pattern part has a height of 0.15t to 0.85t from a lower portion of the side surface of the internal conductor pattern part.

3. The chip electronic component of claim 1, wherein the second insulating layer is further formed on the first insulating layer formed on the upper portion of the internal conductor pattern part.

4. The chip electronic component of claim 3, wherein the second insulating layer formed on the first insulating layer has a thickness of 0.1 μm to 10.5 μm.

5. The chip electronic component of claim 1, wherein conductor pattern portions forming the internal conductor pattern part have the first insulating layer interposed therebetween.

6. The chip electronic component of claim 1, wherein the first insulating layer includes a photoresist (PR).

7. The chip electronic component of claim 1, wherein the second insulating layer contains at least one selected from a group consisting of a novolac based epoxy resin and a rubber based polymer epoxy resin.

8. The chip electronic component of claim 1, wherein the internal conductor pattern part is coated with both of the first and second insulating layers, to avoid a direct contact with a magnetic material forming the magnetic body.

9. A method of manufacturing a chip electronic component, the method comprising:

forming an internal conductor pattern part on at least one surface of an insulating substrate;

forming an insulating layer to coat the internal conductor pattern part therewith;

stacking magnetic layers on upper and lower portions of the internal conductor pattern part formed on the insulating substrate to form a magnetic body; and forming external electrodes on at least one end surface of the magnetic body to be connected to the internal conductor pattern part, wherein the forming of the insulating layer includes forming a first insulating layer coating the upper portion of the internal conductor pattern part and forming a second insulating layer coating a side surface of the internal conductor pattern part.

10. The method of claim 9, wherein the forming of the second insulating layer is performed by vacuum processing after dipping the internal conductor pattern part into a resin used for forming the second insulating layer.

11. The method of claim 10, wherein the resin includes at least one selected from a group consisting of a novolac based epoxy resin and a rubber based polymer epoxy resin.

12. The method of claim 10, wherein the vacuum processing is performed to satisfy 85 torr to 0 torr.

13. The method of claim 10, wherein the vacuum processing is performed for two to ten minutes.

14. The method of claim 9, wherein when a thickness of the internal conductor pattern part is t, the second insulating layer formed on the side surface of the internal conductor pattern part is formed to have a height of 0.15t to 0.85t from a lower portion of the side surface of the internal conductor pattern part.

15. The method of claim 9, wherein the second insulating layer is further formed on the first insulating layer formed on the upper portion of the internal conductor pattern part.

16. The method of claim 9, wherein conductor pattern portions forming the internal conductor pattern part have the first insulating layer interposed therebetween.

* * * * *